United States Patent [19]

Prater

[11] 4,365,172
[45] Dec. 21, 1982

[54] HIGH CURRENT STATIC MOS DRIVER CIRCUIT WITH LOW DC POWER DISSIPATION

[75] Inventor: Cordell E. Prater, Johnson City, Tenn.

[73] Assignee: Texas Instruments Incorporated, Dallas, Tex.

[21] Appl. No.: 111,447

[22] Filed: Jan. 11, 1980

[51] Int. Cl.³ .................... H03K 3/26; H03K 19/094
[52] U.S. Cl. ................................. 307/270; 307/449; 307/571
[58] Field of Search ............... 307/270, 571, 574, 581, 307/449, 450, 475; 330/264

[56] References Cited

U.S. PATENT DOCUMENTS

| | | | |
|---|---|---|---|
| 4,064,405 | 12/1977 | Cricchi et al. | 307/270 |
| 4,096,398 | 6/1978 | Khaitan | 307/270 |
| 4,202,044 | 5/1980 | Beilstein, Jr. et al. | 307/450 |
| 4,234,805 | 11/1980 | Carlsen | 307/270 |
| 4,296,339 | 10/1981 | Murotani | 307/450 |
| 4,306,163 | 12/1981 | Blume, Jr. et al. | 307/449 |

*Primary Examiner*—Stanley D. Miller
*Attorney, Agent, or Firm*—John G. Graham

[57] ABSTRACT

A static push-pull driver circuit employs an enhancement mode input transistor and two parallel load transistors, with an input logic voltage on the gate of the input transistor and its complement on the gates of the load transistors. One load transistor is a depletion mode and the other a "low-threshold" device; the threshold voltage of the low-threshold transistor is much less than that of the enhancement mode input transistor.

8 Claims, 2 Drawing Figures

HIGH CURRENT STATIC MOS DRIVER CIRCUIT WITH LOW DC POWER DISSIPATION

BACKGROUND OF THE INVENTION

This invention relates to semiconductor circuits and more particularly to a static driver circuit of the type useful in semiconductor memory devices or the like for driving capacitive loads.

In semiconductor memory devices of the type described in Electronics, July 20, 1978, pp. 101–106, it is often necessary to employ inverter circuits which drive lines that are heavily loaded capacitively. When the device is designed to have a power down mode of operation, it is found that such circuits may have input signals that are high (at logic 1) during the power down mode; in such case the output of the inverter is low (at logic 0 or Vss), and thus the power dissipation of the circuit becomes very important. It is also often vital that such circuits produce a full logic level output in their high state. Previous circuits used in this type of device have compromised either speed, power dissipation, or output level.

It is therefore the principal object of this invention to provide an improved static driver circuit, particularly one that has low power dissipation. Another object is to provide a push-pull MOS output circuit which has high speed and low power dissipation, yet produces a full logic level output voltage.

SUMMARY OF THE INVENTION

In accordance with an embodiment of the invention, a static push-pull driver circuit employs an enhancement mode input transistor and two parallel load transistors, with an input voltage on the gate of the input transistor and its complement on the gates of the load transistors. One load transistor is a depletion mode and the other a "low-threshold" device; the threshold voltage of the low-threshold transistor is much less than that of the enhancement mode input transistor.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

DETAILED DESCRIPTION OF SPECIFIC EMBODIMENT

Figure 1:
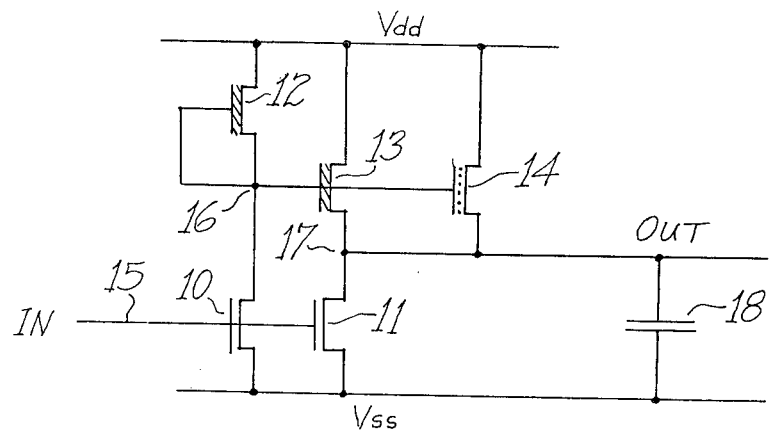
FIG. 1 is an electrical schematic diagram of a circuit according to the invention.

Referring to FIG. 1, a static driver circuit according to the invention consists of two input transistors 10 and 11 with a depletion load 12 for the first input transistor 10 and a pair of load transistors 13 and 14 for the second input transistor 11. The load transistor 13 is a depletion mode device and the load transistor 14 is a low-threshold "natural" transistor.

A natural transistor is that which has no threshold-adjusting implant in its channel region so it exhibits the threshold voltage inherent in the semiconductor material used for the substrate. In a typical N-channel silicon gate process, the transistors 10 and 11 are standard enhancement mode devices implanted with boron at a light dosage to produce a threshold of about +0.8 V, based on a +5 V supply Vdd; the depletion mode transistors 12 and 13 are implanted with phosphorus to produce a threshold of below zero, about −3 V, and the natural transistor 14 is not implanted so its threshold is about +0.2.

The gates of the input transistors 10 and 11 are both connected to an input terminal 15 which has a voltage thereon of either 0 or a "1" logic level of Vdd or (Vdd−Vt). The gates of the transistors 13 and 14 are connected together and to a node 16 which represents the output of the first stage formed by the transistors 10 and 12. The output of the circuit is a node 17 between the input transistor 11 and its loads 13 and 14. The output node 17 is assumed to drive a load containing a large capacitor 18.

Figure 2:
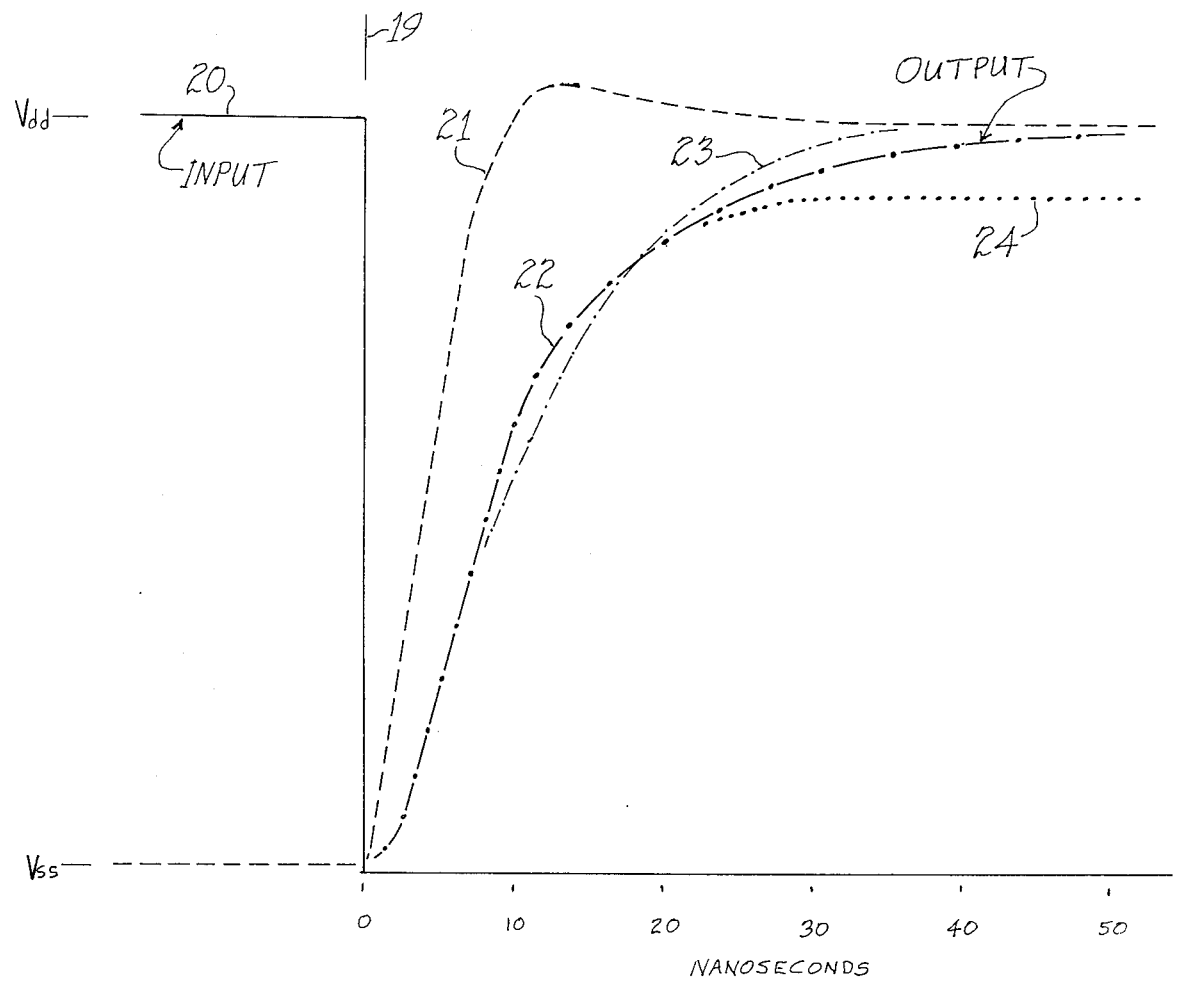
FIG. 2 is a graphic representation of voltage waveforms appearing in the circuit of FIG. 1.

In operation, at time 19 when the input 15 goes low as seen by a line 20 in FIG. 2, the node 16 rises very quickly as seen by a line 21 because this node is driving only the gate capacitance of the transistors 12,13,14. Prior to this time 19, the input transistor 10 had been on full and the node 16 at Vss, so the transistor 14 was held off and power dissipation was only that through the depletion transistors 12 and 13, which is low because of the current limiting characteristics of depletion devices. After time 19, when the voltage on the node 16 reaches a level more than the Vt of the transistor 14 (approximately +0.2) above the output node 17, then the transistor 14 turns on and provides the major charging current for the load capacitor 18. The transistor 14 can be a very wide device, and hence can supply very large amounts of transient current, but contributes no direct current because it is off in either d.c. state. That is, when the output node 17 has charged to within 0.2 V of Vdd or node 16, the transistor 14 cuts off. A large depletion device here would dissipate when Vin=1. The voltage on the output node 17 is shown by a line 22 in FIG. 2; for transistor sizes of 0.2/0.24 channel width to length ratio (in mils) for the transistor 12, 0.24/0.24 for transistor 13, and 3.0/0.12 for the transistor 14, and a 4 pf load 18, the steady state "on" current is about 150 microamp for the circuit of FIG. 1. In contrast, in a circuit without the transistor 14 and a large depletion transistor 13 (1.74/0.24), the steady state current is over 700 microamp and the speed is about the same as seen by a line 23 in FIG. 2. On the other hand, omitting the transistor 13 will produce an output 17 seen by the line 24 of FIG. 2, where the Vdd level is not reached but instead the output stays at one Vt below Vdd; here the current dissipation is about 70 microamp.

Thus, the circuit of FIG. 1 combines the high speed and high output levels of a depletion push-pull output stage with the low d.c. power dissipation of an enhancement push-pull stage.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A circuit comprising an input transistor, a first load transistor, and a second load transistor, each said transistor being an insulated-gate field-effect transistor having a current path and a control electrode and having a threshold voltage level for the control electrode at which the current path becomes conductive, the current paths of said first and second load transistors being connected in parallel, the control electrodes of the first and second load transistors being connected together, the current path of the input transistor being connected in series with the parallel current paths of the first and second load transistors, means applying a logic voltage to the control electrode of the input transistor and its complement to the control electrodes of both the first and second load transistors, a node between the current path of the input transistor and the current paths of the load transistors providing an output, the threshold voltage of the second load transistor having a magnitude less than that of the input transistor but more than that of said first load transistor, said first load transistor being a depletion mode transistor.

2. A circuit according to claim 1 wherein said second load transistor has a channel width to length ratio much larger than that of said first load transistor.

3. A circuit according to claim 2 wherein said width to length ratio is many times that of said first load transistor.

4. A circuit according to claim 3 wherein said second load transistor is a "low-threshold" transistor and said input transistor in an implanted enhancement transistor having a threshold much larger than that of the second load transistor.

5. A circuit comprising an input transistor, a first load transistor, and a second load transistor, each said transistor having a current path and a control electrode and having a threshold voltage level for the control electrode at which the current path becomes conductive, the current paths of said first and second load transistors being connected in parallel, the control electrodes of the first and second load transistors being connected together, the current path of the input transistor being connected in series with the parallel current paths of the first and second load transistors, means applying a logic voltage to the control electrode of the input transistor and its complement to the control electrodes of both the first and second load transistors, a node between the current path of the input transistor and the current paths of the load transistors providing an output, the threshold voltage of the second load transistor having a magnitude less than that of the input transistor but more than that of said first load transistor, wherein the means for applying a logic voltage comprises an inverter stage having a driver transistor and a depletion load transistor, an input terminal connected to the control electrodes of both said driver transistor and said input transistor, the output of said inverter being connected to the control electrodes of both said first and second load transistors.

6. A circuit according to claim 5 wherein said input transistor and first and second load transistors are all N-channel insulated gate field effect transistors.

7. A circuit according to claim 6 wherein said second load transistor has a channel width to length ratio much greater than that of said first load transistor and said depletion load transistor.

8. A circuit according to claim 7 wherein said first load transistor is a depletion mode transistor.

* * * * *